US012672504B2

(12) United States Patent
Jang et al.

(10) Patent No.: US 12,672,504 B2
(45) Date of Patent: Jun. 30, 2026

(54) SUBSTRATE PROCESSING APPARATUS AND SUBSTRATE PROCESSING METHOD USING THE SAME

(71) Applicant: Samsung Electronics Co., Ltd., Suwon-si (KR)

(72) Inventors: Hunjae Jang, Suwon-si (KR); Sangjine Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 96 days.

(21) Appl. No.: 18/410,382

(22) Filed: Jan. 11, 2024

(65) Prior Publication Data

US 2025/0029845 A1    Jan. 23, 2025

(30) Foreign Application Priority Data

Jul. 17, 2023    (KR) ........................ 10-2023-0092703

(51) Int. Cl.
H10P 72/00        (2026.01)
B08B 3/04        (2006.01)
(Continued)

(52) U.S. Cl.
CPC .......... H10P 72/0414 (2026.01); B08B 3/041 (2013.01); B08B 3/08 (2013.01);
(Continued)

(58) Field of Classification Search
CPC ......... H01L 21/67051; H01L 21/02057; H01L 21/67034; H01L 21/6708; H01L 21/02101; B08B 3/041; B08B 3/08; B08B 3/10; B05B 1/005; B05B 1/10; B05B 12/087; B05B 15/40
See application file for complete search history.

(56) References Cited

U.S. PATENT DOCUMENTS

| | | |
|---|---|---|
| 6,576,066 B1 | 6/2003 | Namatsu |
| 7,011,715 B2 | 3/2006 | Verhaverbeke |
| (Continued) | | |

FOREIGN PATENT DOCUMENTS

| | | |
|---|---|---|
| JP | 4042412 B2 | 2/2008 |
| JP | 2022015151 A | 1/2022 |

OTHER PUBLICATIONS

A. Mulero, I. Cachadina and M. I. Parra, "Recommended Correlations for the Surface Tension of Common Fluids". Journal of Physical and Chemical Reference Data (2012). 41 043105.

(Continued)

*Primary Examiner* — Erin F Bergner
(74) *Attorney, Agent, or Firm* — Muir Patent Law, PLLC

(57)        ABSTRACT

Provided is a substrate processing apparatus including a process chamber including a process space, a stage configured to support a substrate, a rotator configured to rotate the stage, a pressurizing pump configured to increase a pressure in the process space, and a cleaning agent discharger configured to spray a cleaning agent into the process space. The cleaning agent discharger includes a discharge ring including a discharge path through which the cleaning agent flows and a plurality of discharge nozzles connected to the discharge ring and spaced apart in a circumferential direction about a central axis of the stage.

13 Claims, 11 Drawing Sheets

(51) Int. Cl.
　　B08B 3/08　　　　(2006.01)
　　B08B 3/10　　　　(2006.01)
　　H10P 70/00　　　(2026.01)

(52) U.S. Cl.
　　CPC ................ B08B 3/10 (2013.01); H10P 70/20
　　　　(2026.01); H10P 72/0408 (2026.01)

(56) References Cited

U.S. PATENT DOCUMENTS

| | | | |
|---|---|---|---|
| 7,736,591 | B2 | 6/2010 | Rose et al. |
| 10,720,320 | B2 | 7/2020 | Emoto et al. |
| 10,777,405 | B2 | 9/2020 | Gouk et al. |
| 10,825,713 | B2 | 11/2020 | Yoshihara et al. |
| 11,289,324 | B2 | 3/2022 | Okutani |
| 2002/0189543 | A1* | 12/2002 | Biberger .......... H01L 21/67069 |
| | | | 156/345.33 |
| 2004/0123484 | A1* | 7/2004 | Yoshikawa .......... B08B 7/0021 |
| | | | 34/410 |

| | | | |
|---|---|---|---|
| 2006/0065636 | A1* | 3/2006 | Babic ........................ C23F 1/12 |
| | | | 134/1.2 |
| 2006/0231125 | A1 | 10/2006 | Yi |
| 2007/0240740 | A1* | 10/2007 | McDermott ............. B01J 19/18 |
| | | | 257/E21.255 |
| 2012/0006356 | A1 | 1/2012 | Kamikawa |
| 2018/0294170 | A1* | 10/2018 | Zhao ................... H10P 72/0402 |
| 2018/0358242 | A1* | 12/2018 | Kim ................. H01L 21/67126 |

OTHER PUBLICATIONS

Barr-David, F; B. F. Dodge, "Vapor-Liquid Equilibrium at High Pressures. The Systems Ethanol-Water and 2-Propanol-Water". Journal of Chemical and Engineering Data. (1959). 4 (2): 107-121.

Joseph J. Jasper, "The Surface Tension of Pure Liquid Compounds". Journal of Physical and Chemical Reference Data (1972).1 841.

Parks, J. S.; B. Barton, "Vapor pressure data for isopropyl alcohol and tertiary butyl alcohol". Journal of the American Chemical Society. (1928). 50: 24-26.

\* cited by examiner

SUBSTRATE PROCESSING APPARATUS AND SUBSTRATE PROCESSING METHOD USING THE SAME

CROSS-REFERENCE TO RELATED APPLICATION

This U.S. non-provisional patent application claims priority under 35 U.S.C. § 119 to Korean Patent Application No. 10-2023-0092703, filed on Jul. 17, 2023, in the Korean Intellectual Property Office, the entire contents of which are hereby incorporated by reference.

BACKGROUND OF THE INVENTION

The inventive concept relates to a substrate processing apparatus and a substrate processing method using the same, and in detail, relates to a substrate processing apparatus capable of increasing a boiling point of a cleansing agent by increasing atmospheric pressure in a process chamber and a substrate processing method using the same.

Semiconductor devices may be manufactured through several processes. Semiconductor processes include processes such as photolithography, etching, and deposition, and physical or chemical residues remain after each process. Removing this residue is a cleaning process. When cleaning is not done properly, performance and reliability of a product may be adversely affected. As circuit line width of a substrate becomes smaller in nanometers, a trench for making a capacitor becomes narrower and deeper. As a result, it becomes increasingly difficult to dig out residues in the trench, and the importance of the cleaning process has increased.

Cleaning processes may include wet cleaning, dry cleaning, and steam cleaning. Among these, a cleaning agent may be used when performing a drying process after wet etching. A conventional cleaning process may include fixing atmospheric pressure in a process chamber at 1 atm and increasing temperature inside the process chamber, increasing the temperature and pressure inside the process chamber until the cleaning agent reaches a supercritical state, and drying the inside of the process chamber.

SUMMARY

An object of the inventive concept is to provide a substrate processing apparatus capable of increasing an internal pressure of a process chamber and a substrate processing method using the same.

An object of the inventive concept is to provide a substrate processing apparatus capable of increasing an internal temperature of a process chamber and a substrate processing method using the same.

An object of the inventive concept is to provide a substrate processing apparatus capable of increasing a boiling point of a cleaning agent and a substrate processing method using the same.

An object of the inventive concept is to provide a substrate processing apparatus capable of controlling a spray amount of a cleaning agent discharged by an elastic portion controlled by a piezoelectric element and a substrate processing method using the same.

An object of the inventive concept is to provide a substrate processing apparatus capable of controlling a spray cycle of a cleaning agent discharged by an elastic portion controlled by a piezoelectric element and a substrate processing method using the same.

The problem to be solved by the inventive concept is not limited to the problems mentioned above, and other problems not mentioned will be clearly understood by those skilled in the art from the following description.

A substrate processing apparatus according to some embodiments of the inventive concept may include a process chamber including a process space; a stage configured to support a substrate; a rotator configured to rotate the stage; a pressurizing pump configured to increase a pressure in the process space; and a cleaning agent discharger configured to spray a cleaning agent into the process space, wherein the cleaning agent discharger includes: a discharge ring including a discharge path through which the cleaning agent flows; and a plurality of discharge nozzles connected to the discharge ring and spaced apart in a circumferential direction about a central axis of the stage.

A substrate processing apparatus according to some embodiments of the inventive concept may include a process chamber including a process space; a stage in the process space and configured to support a substrate; a rotator below the stage and configured to rotate the stage; a pressurizing pump configured to increase a pressure in the process space; and a cleaning agent discharger configured to spray a cleaning agent into the process space, wherein the cleaning agent discharger includes: a discharge ring including a discharge passage; and a discharge nozzle connected to the discharge ring, and wherein the discharge nozzle includes: a discharge body including a spray space connected to the discharge passage and a central hole through which the cleaning agent is sprayed into the process space; a piezoelectric element; and an elastic portion including an elastic hole that is opened and closed by the piezoelectric element, the elastic portion being configured to discharge the cleaning agent from the discharge passage into the process space to control a spraying cycle and a spraying amount of the cleaning agent.

A substrate processing method according to some embodiments of the inventive concept may include introducing a substrate into a substrate processing apparatus; injecting pressurized gas into the substrate processing apparatus to increase a pressure inside the substrate processing apparatus to a first pressure or higher; and drying the substrate after the pressure inside the substrate processing apparatus becomes higher than the first pressure, wherein the substrate processing apparatus includes: a process chamber including a process space; a stage configured to support a substrate; a heater configured to increase a temperature of the process space; a rotator configured to rotate the stage; a pressurizing pump configured to increase a pressure in the process space; and a cleaning agent discharger configured to spray a cleaning agent into the process space, wherein the cleaning agent discharger is on the stage and includes a plurality of discharge nozzles spaced apart in a circumferential direction around a central axis of the stage, and wherein the drying of the substrate includes: increasing a temperature of the process space to a first temperature or higher using the heater; and spraying a cleaning agent from the discharge nozzle after raising the temperature of the process space to the first temperature or higher.

Specific details of other embodiments are included in the detailed description and drawings.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
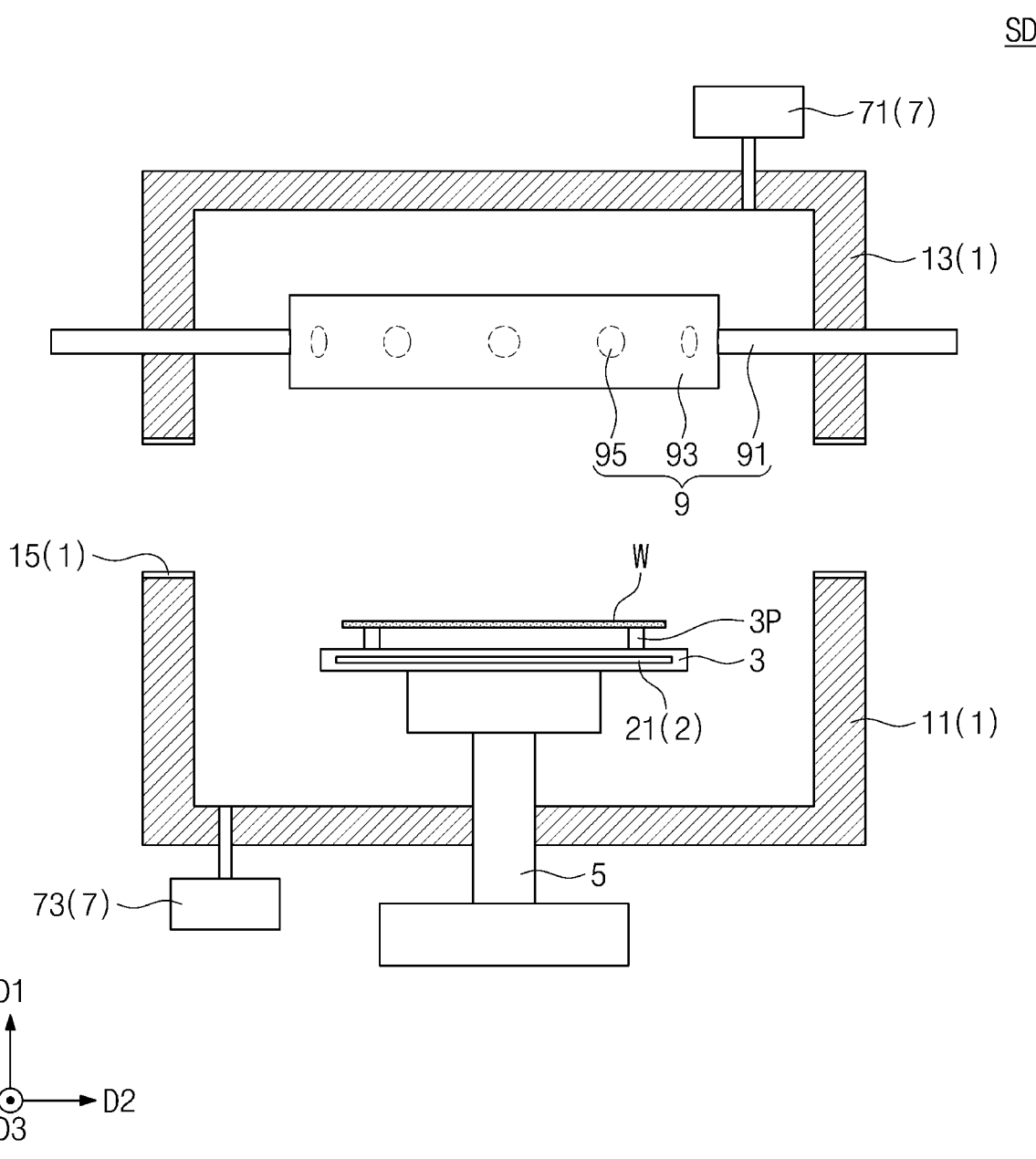
FIG. 1 is a cross-sectional view illustrating a substrate processing apparatus according to embodiments of the inventive concept.

The following will now describe some example embodiments of the present inventive concepts with reference to the accompanying drawings. Like reference numerals may indicate like components throughout the description.

Hereinafter, 'D1' may be referred to as a first direction, 'D2' crossing the first direction D1 may be referred to as a second direction, and 'D3' crossing each of the first direction D1 and the second direction D2 may be referred to as a third direction. The first direction D1 may be referred to as an upward direction, and the direction opposite to the first direction D1 may be referred to as a downward direction. Additionally, each of the second direction D2 and the third direction D3 may be referred to as a horizontal direction.

Figure 2:
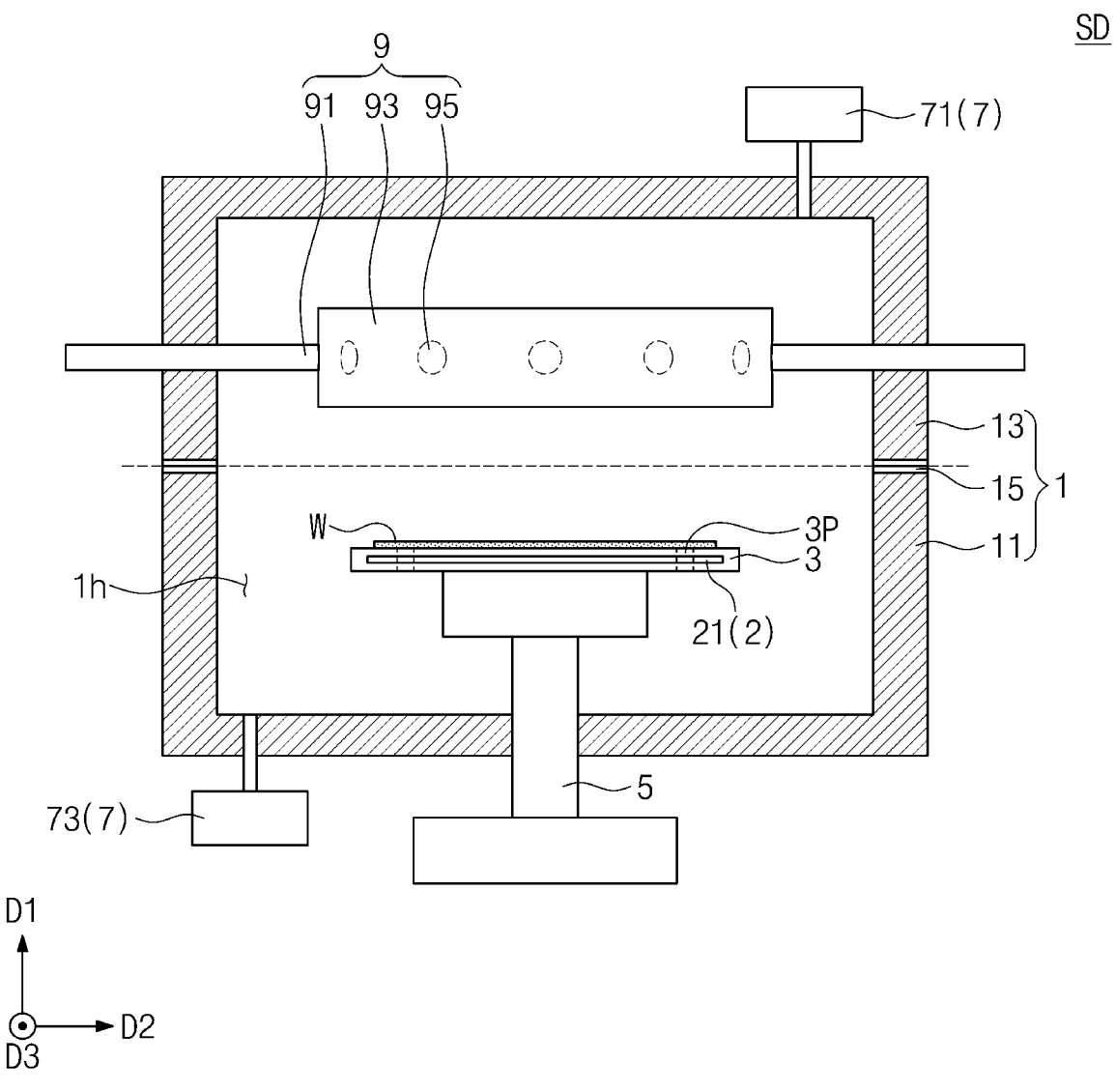
FIG. 2 is a cross-sectional view illustrating a substrate processing apparatus according to embodiments of the inventive concept.
Figure 3:
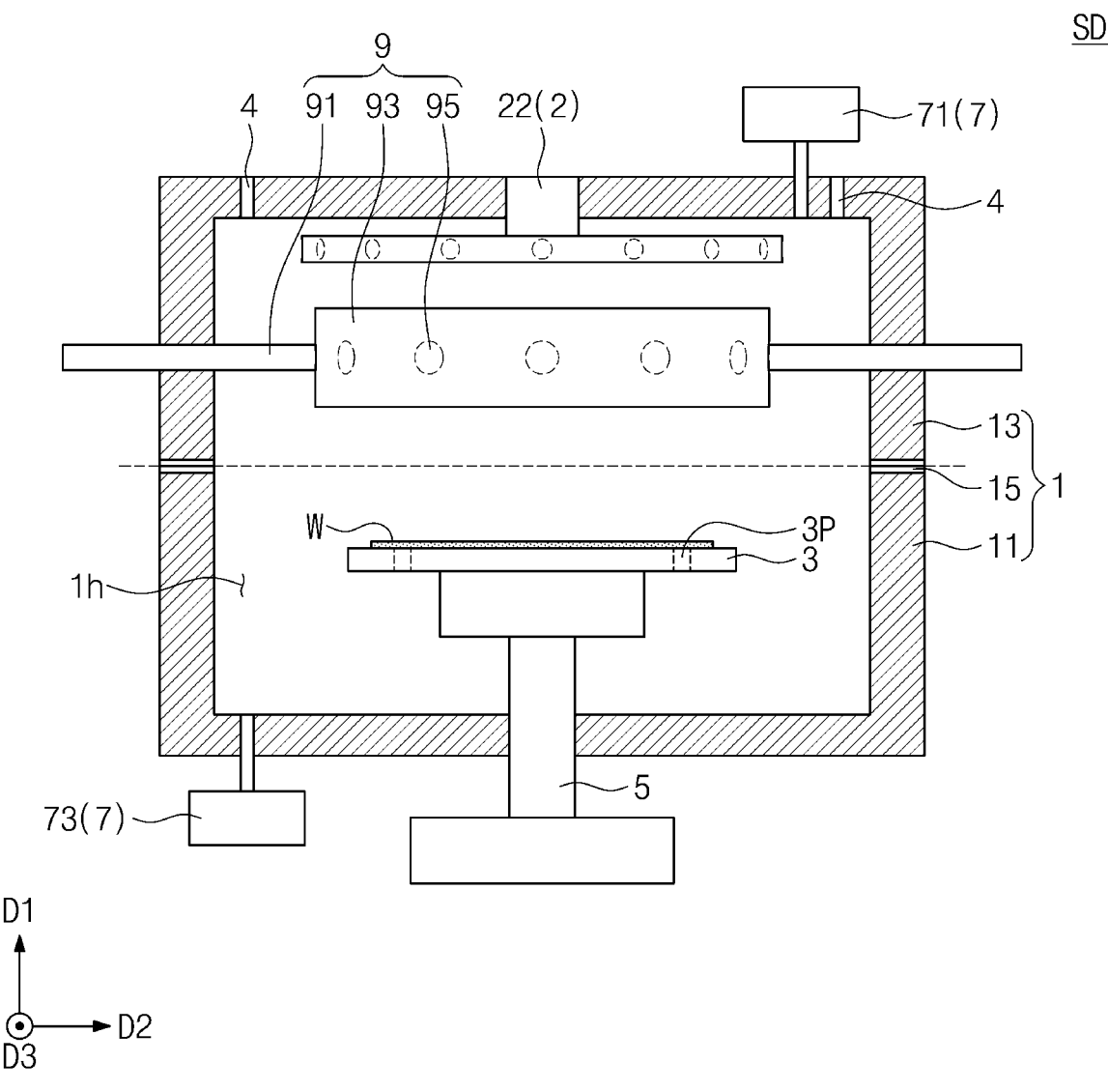
FIG. 3 is a cross-sectional view illustrating a substrate processing apparatus according to embodiments of the inventive concept.
Figure 4:
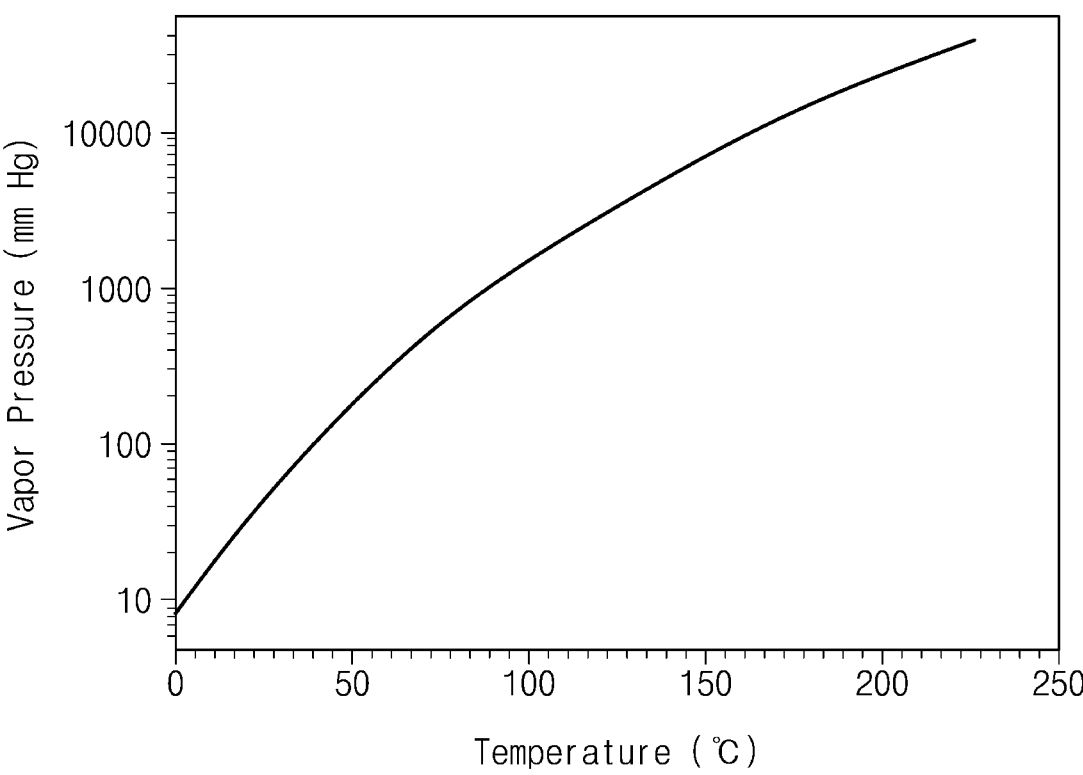
FIG. 4 is a graph illustrating a change in vapor pressure of a cleaning agent as temperature increases.
Figure 5:
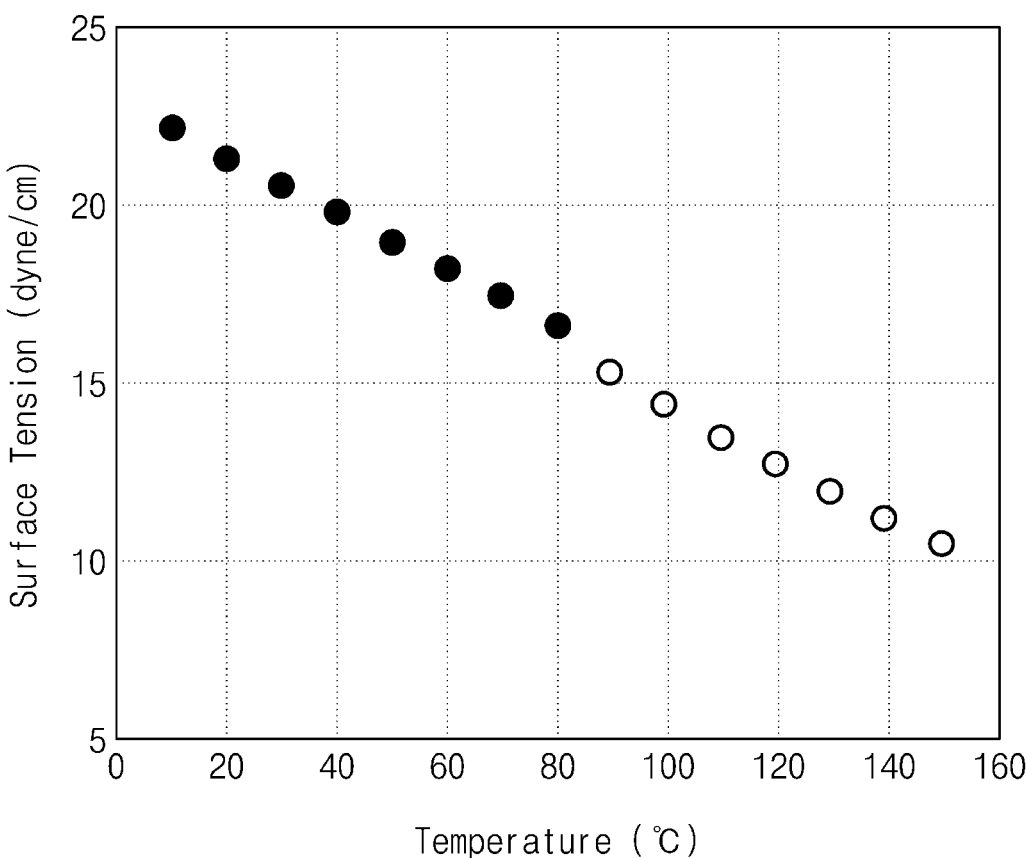
FIG. 5 is a graph illustrating a change in surface tension of a cleaning agent as temperature increases.

FIG. 1 is a cross-sectional view illustrating a substrate processing apparatus SD according to embodiments of the inventive concept, FIG. 2 is a cross-sectional view illustrating a substrate processing apparatus SD according to embodiments of the inventive concept, FIG. 3 is a cross-sectional view illustrating a substrate processing apparatus SD according to embodiments of the inventive concept, FIG. 4 is a graph illustrating a change in vapor pressure of a cleaning agent CL as temperature increases, and FIG. 5 is a graph illustrating a change in surface tension of a cleaning agent CL as temperature increases.

Referring to FIGS. 1 and 2, a substrate processing apparatus SD may be provided. The substrate processing apparatus SD may include a process chamber 1, a stage 3, a rotator 5, a pressurizing pump 7, a cleaning agent discharger 9, and a heater 2.

A substrate W may be placed in the process chamber 1. In this specification, the substrate W may refer to a silicon (Si)

wafer, but is not limited thereto. The process chamber 1 may be a high-pressure vessel with pressure resistance. The process chamber 1 may include steel use stainless (SUS). The thickness of the walls of the process chamber 1 may be sufficient to withstand a pressure increase in the process space 1h of, for example, 3 atm. For example, the thickness of the walls of the process chamber 1 may be 2.5 mm or more. However, the thickness of the walls of the process chamber 1 is not limited thereto. For example, the process chamber 1 may be a chemical process fluid handling vessel with a working pressure of 0.2 kg*f/cm$^2$ (20 kPa). However, the inventive concept is not limited thereto. The process chamber 1 may prevent the cleaning agent CL on the substrate W from leaking out and prevent contamination of the substrate W. The cleaning agent CL may be alcohol. In detail, the cleaning agent CL may be one of methyl alcohol (methanol, $CH_3OH$), ethyl alcohol (ethanol, $C_2H_6O$), and isopropyl alcohol (IPA, $C_3H_8O$). In this specification, for convenience, isopropyl alcohol (IPA) is used as the cleaning agent CL. The process chamber 1 may include a process space 1h (see, e.g., FIG. 2). The process chamber 1 may include a first process chamber 11 (e.g., a first portion of the process chamber 1), a second process chamber 13 (e.g., a second portion of the process chamber 1), and a coupling portion 15 (e.g., a seal or coupling). Referring to FIG. 1, the second process chamber 13 may be selectively combined with the first process chamber 11. The process space 1h may be opened and closed by relative movement of the second process chamber 13 and the first process chamber 11. The coupling portion 15 may couple the first process chamber 11 and the second process chamber 13. The process space 1h may be sealed by the coupling portion 15. The coupling portion 15 may include, for example, an O-ring, but is not limited thereto. For example, the coupling portion 15 may seal the process space 1h to become airtight so that the pressure therein may be increased or decreased relative to atmospheric pressure. The first process chamber 11 and the second process chamber 13 may be arranged vertically. For example, the second process chamber 13 may be disposed on the first process chamber 11. However, a positional relationship between the first process chamber 11 and the second process chamber 13 is not limited thereto. The first process chamber 11 and the second process chamber 13 may be arranged left and right. The second process chamber 13 may be a cover of the first process chamber 11. When the first process chamber 11 and the second process chamber 13 are separated (e.g., in an uncoupled state), the substrate W may be placed on the stage 3.

The stage 3 may support the substrate W. The stage 3 may include a flat ring shape or a disk shape. The stage 3 may be located in the process space 1h. The stage 3 may be rotated by the rotator 5. The stage 3 may rotate the substrate W. For example, the stage 3 may rotate the substrate W at about 10 rpm to about 7000 rpm. The stage 3 may include a support pin 3P. When the first process chamber 11 and the second process chamber 13 are separated, the support pin 3P may rise upward to support the substrate W (see, e.g., FIG. 1). The substrate W may be stably supported on the stage 3 by the support pin 3P. As the support pin 3P rises, loading and unloading of the substrate W may become easier.

The rotator 5 may rotate the substrate W by rotating the stage 3. The rotator 5 may be located below the stage 3. The rotator 5 may be coupled to a lower portion of the stage 3. The rotation speed and direction of the substrate W may be controlled by the rotator 5.

The pressurizing pump 7 may control a pressure inside the process chamber 1. The pressure inside the process chamber 1 may mean a pressure in the process space 1*h*. The pressurizing pump 7 may include an inlet pump 71 and an outlet pump 73. The inlet pump 71 may be connected to one side of the process space 1*h* to inject pressurized gas into the process space 1*h*. The outlet pump 73 may be connected to the other side of the process space 1*h* to discharge the pressurized gas in the process space 1*h*. The atmospheric pressure inside the process chamber 1 may be raised or lowered by the pressurizing pump 7. For example, the inlet pump 71 may increase a pressure of the process space 1*h* to 2.5 atm or more. In detail, the inlet pump 71 may increase a pressure of the process space 1*h* to 3 atm or more. For example, the inlet pump 71 may increase a pressure of the process space 1*h* to between 2.5 atm and 3.5 atm. After a drying process of the substrate W is completed, a pressure in the process space 1*h* may be lowered to atmospheric pressure by the outlet pump 73. However, the inventive concept is not limited thereto, and the pressure in the process space 1*h* may be lowered to 1 atm or less by the outlet pump 73.

Referring to FIG. 4, a horizontal axis may represent temperature. A vertical axis may represent vapor pressure. A graph in FIG. 4 may indicate a vapor pressure of IPA that varies depending on temperature. The pressurizing pump 7 may increase a boiling point of IPA by increasing the pressure inside the process chamber 1. Referring to the graph of FIG. 4, it may be seen that as the temperature of IPA increases, the vapor pressure of IPA also increases. When the vapor pressure of IPA becomes equal to an internal pressure of the process chamber 1, IPA may be vaporized. Referring to FIG. 5, the horizontal axis may represent temperature. The vertical axis may represent surface tension. The graph in FIG. 5 may indicate a surface tension of IPA that varies depending on temperature. As the temperature of the cleaning agent increases, the surface tension may weaken. In detail, as the temperature of IPA increases, the surface tension of IPA may decrease. As the surface tension of IPA is lowered, collapse of a pattern formed on the substrate W when the substrate W is dried may be decreased.

The cleaning agent discharger 9 may receive the cleaning agent CL from the outside and spray the cleaning agent CL into the process space 1*h*. The cleaning agent discharger 9 may include a pipe 91, a discharge ring 93, and a discharge nozzle 95. The cleaning agent CL may flow through the pipe 91 and the discharge ring 93. The discharge ring 93 may provide a discharge passage 93*h* (refer to FIG. 10), which is a space through which the cleaning agent CL flows. The pipe 91 and the discharge ring 93 may include SUS. The discharge ring 93 may be connected to the pipe 91 and may supply the cleaning agent CL to the discharge nozzle 95. A plurality of discharge nozzles 95 may be provided. In detail, the plurality of discharge nozzles 95 may be arranged to be spaced upward from the stage 3. The plurality of discharge nozzles 95 may be spaced apart from each other in a circumferential direction around a central axis of the stage 3. The plurality of discharge nozzles 95 may be arranged on an inner surface of the discharge ring 93 to spray the cleaning agent CL toward the central axis of the stage 3 as shown, e.g., in FIGS. 6 and 7. For example, the discharge ring 93 may be positioned above the stage 3 and may have a central axis that is aligned with the central axis of the stage 3. However, the arrangement structure of discharge ring 93 and of the plurality of discharge nozzles 95 is not limited thereto. The plurality of discharge nozzles 95 may be arranged to evenly spray the cleaning agent CL onto the substrate W. Hereinafter, the plurality of discharge nozzles 95 may be described as singular for convenience. The discharge nozzle 95 may receive the cleaning agent CL from the discharge ring 93 and spray the cleaning agent CL into the process space 1*h*. Details about the discharge nozzle 95 will be described later.

The heater 2 may apply heat to the process space 1*h*. The heater 2 may heat the upper surface of the stage 3. The heater 2 may heat the substrate W on the stage 3. Referring to FIGS. 1 and 2, the heater 2 may include a first heater 21. The first heater 21 may be located inside the stage 3 and may apply heat to the stage 3. Referring to FIG. 3, the heater 2 may include a second heater 22. The second heater 22 may include an infrared light source capable of applying infrared light to an upper surface of the stage 3 to heat the upper surface of the stage 3. However, the inventive concept is not limited thereto. The first heater 21 and the second heater 22 may include a heating wiring or a laser light emitting device. The second heater 22 may be coupled to (e.g., attached to or fixed to) one of an upper surface or a side surface of the process chamber 1 to face the stage 3. However, positions and directions of the first heater and the second heater are not limited thereto. The first heater 21 and the second heater 22 may have various forms capable of applying heat to the substrate W on the stage 3.

Referring to FIG. 3, the substrate processing apparatus SD may further include an inert gas nozzle 4. The inert gas nozzle 4 may be connected to the process space 1*h*. The inert gas nozzle 4 may inject an inert gas into the process space 1*h*. The inert gas may include, but is not limited to, nitrogen gas. A drying process of the substrate W may be facilitated by the inert gas. The inert gas may be used when raising the temperature of the process space 1*h* to a high temperature. Particles on the substrate W may be diffused by the inert gas. The particles may escape from the surface of the substrate W due to the inert gas. The inert gas may adsorb the particles. The inert gas may combine with the particles on the surface of the substrate W and remove the particles from the surface of the substrate W.

The substrate processing apparatus SD may further include an ultrasonic module (not shown). The ultrasonic module may transmit a sound wave to the substrate W to separate the particles, thereby increasing the effect of cleaning and drying.

Figure 6:
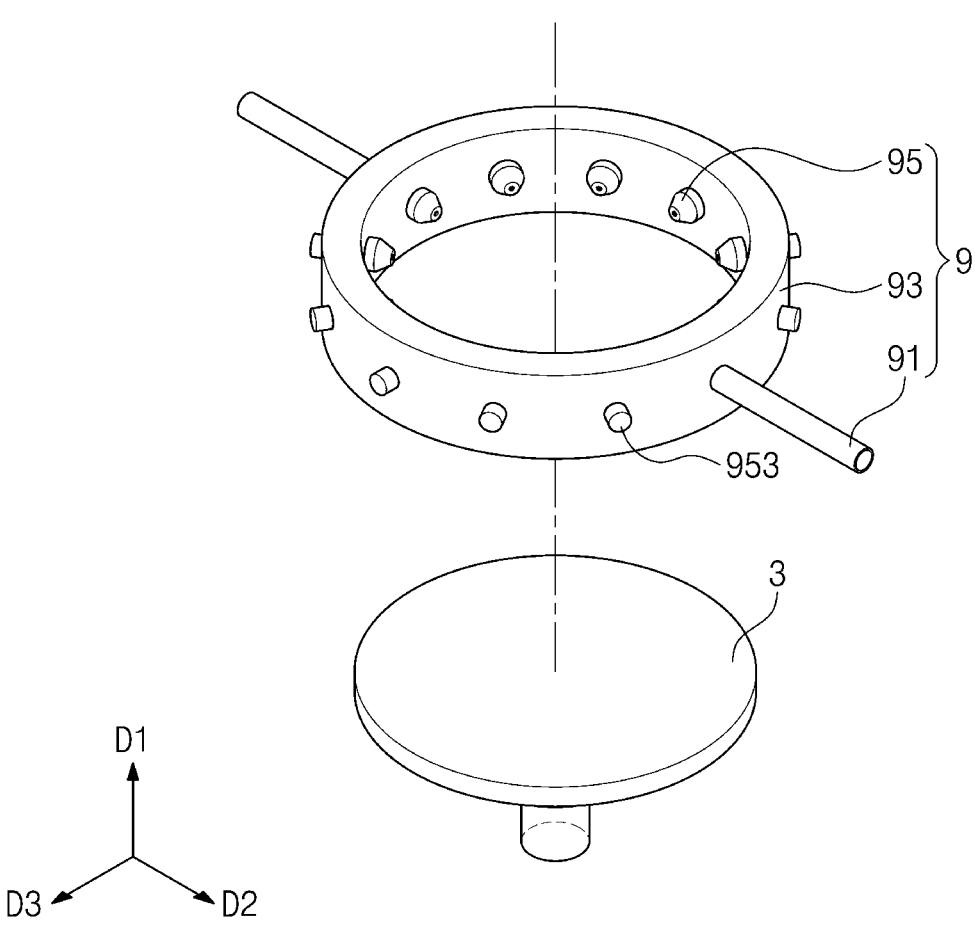
FIG. 6 is a perspective view illustrating a cleaning agent discharger and a stage according to embodiments of the inventive concept.
Figure 7:
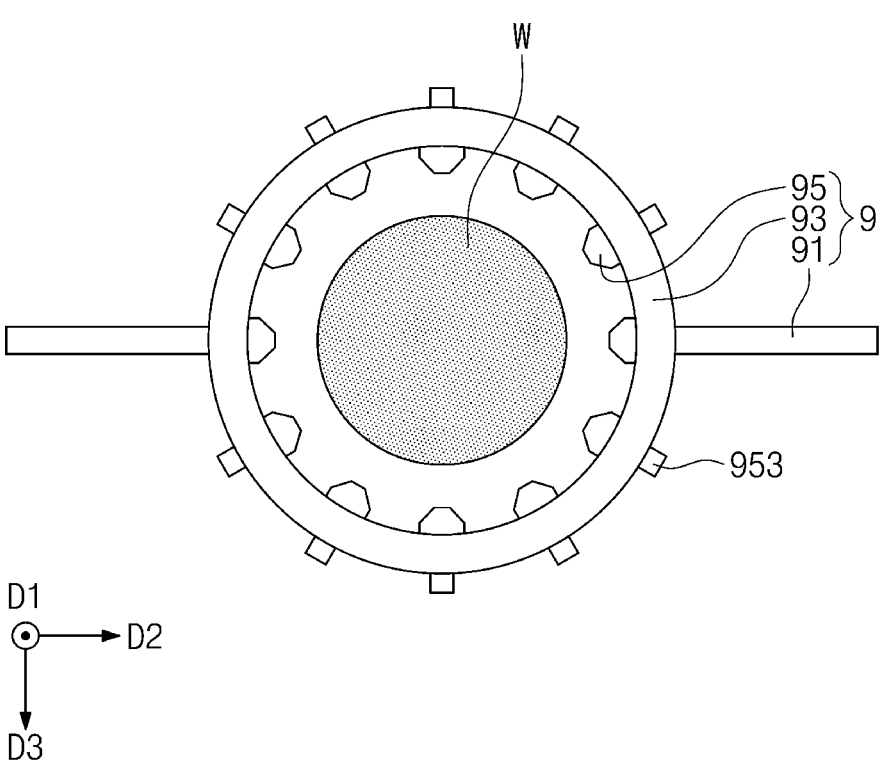
FIG. 7 is a plan view illustrating a cleaning agent discharger and a substrate according to embodiments of the inventive concept.
Figure 8:
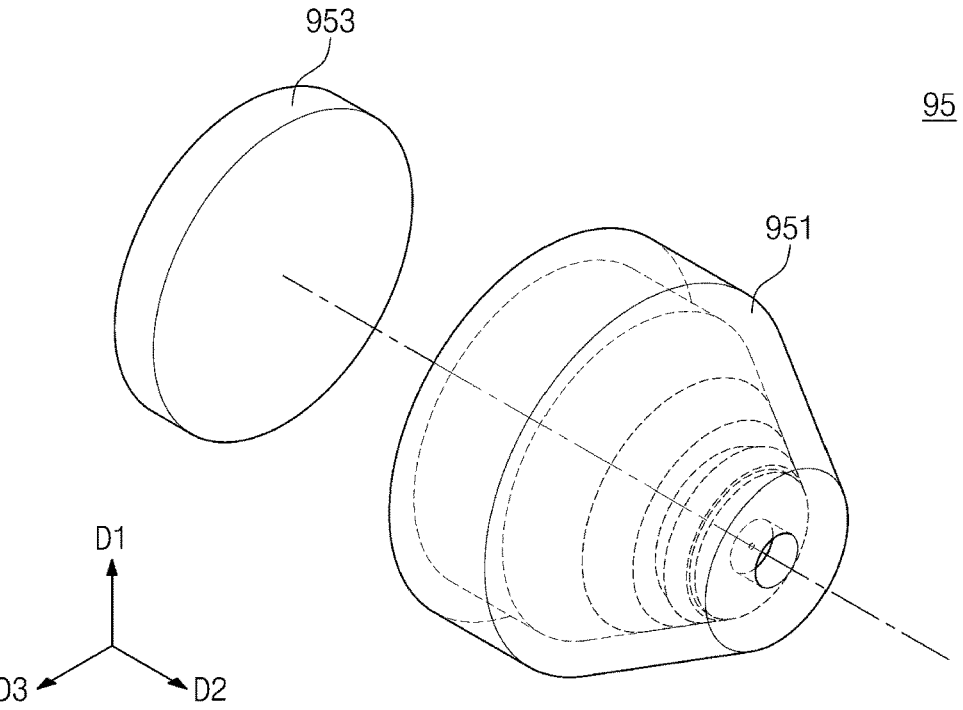
FIG. 8 is a perspective view illustrating a discharge nozzle according to embodiments of the inventive concept.
Figure 9:
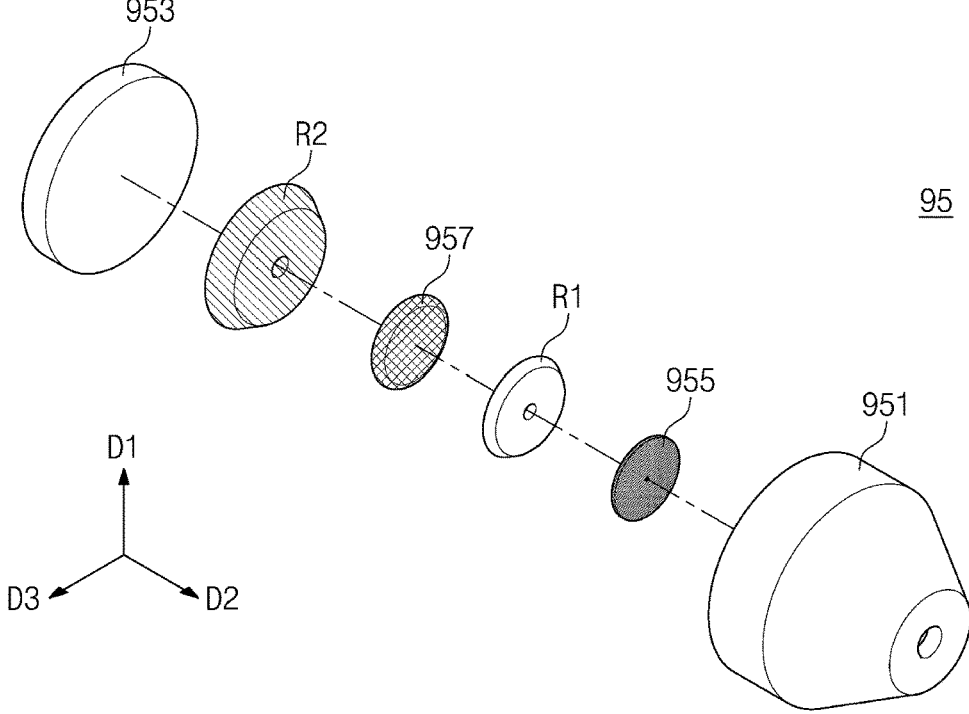
FIG. 9 is an exploded perspective view illustrating a discharge nozzle according to embodiments of the inventive concept.
Figure 10:
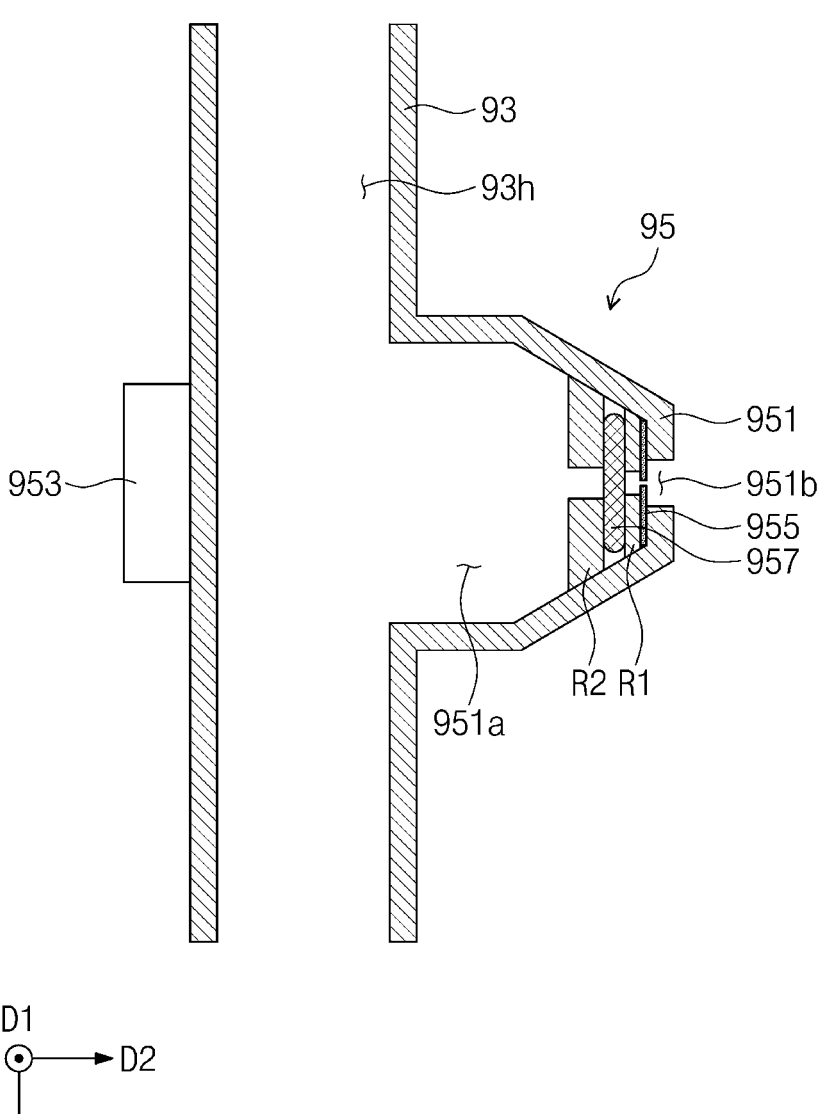
FIG. 10 is a plan view illustrating a discharge nozzle according to embodiments of the inventive concept.
Figure 11:
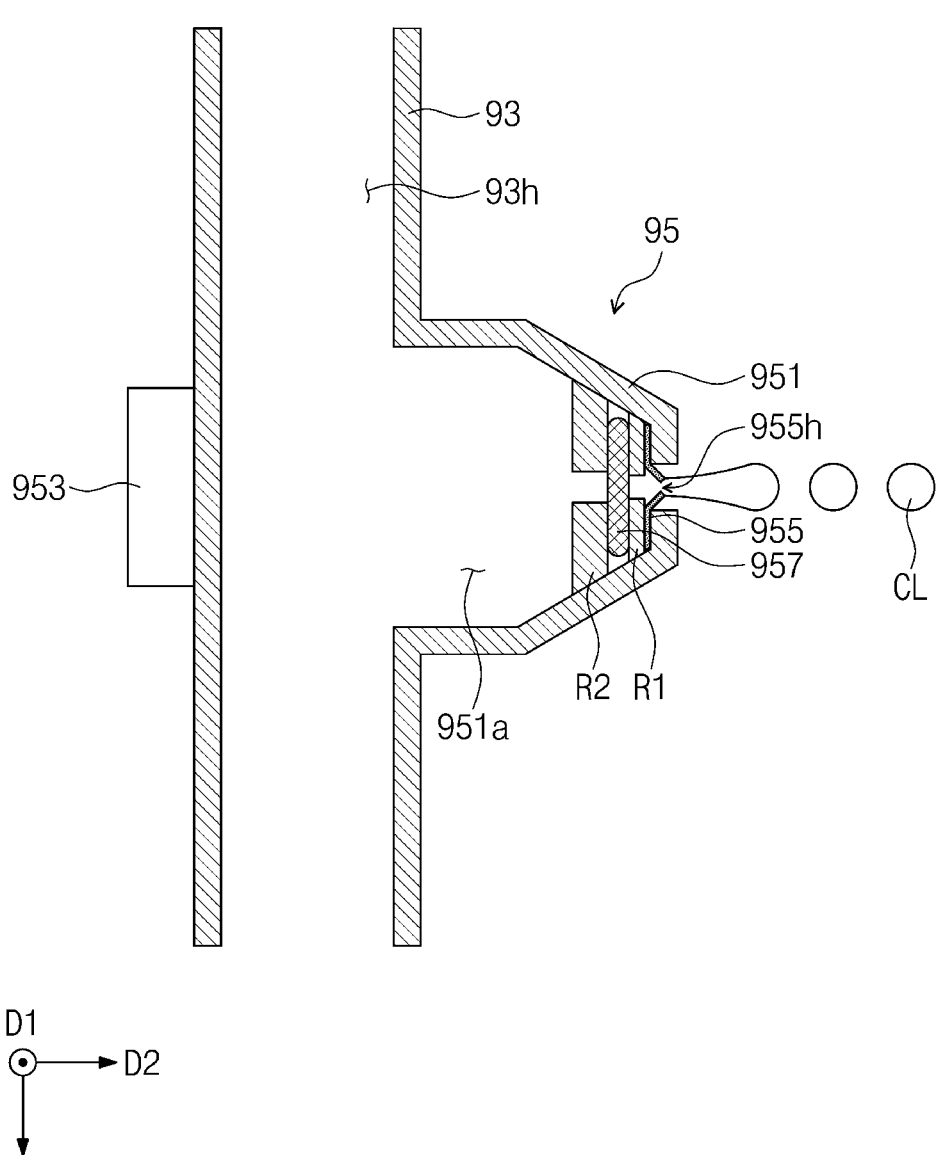
FIG. 11 is a plan view illustrating a discharge nozzle according to embodiments of the inventive concept.

FIG. 6 is a perspective view illustrating a cleaning agent discharger and a stage according to embodiments of the inventive concept, FIG. 7 is a plan view illustrating a cleaning agent discharger 9 and a substrate W according to embodiments of the inventive concept, FIG. 8 is a perspective view illustrating a discharge nozzle according to embodiments of the inventive concept, FIG. 9 is an exploded perspective view illustrating a discharge nozzle according to embodiments of the inventive concept, FIG. 10 is a plan view illustrating a discharge nozzle 95 according to embodiments of the inventive concept, and FIG. 11 is a plan view illustrating a discharge nozzle 95 according to embodiments of the inventive concept.

Referring to FIGS. 6 and 7, the discharge nozzle 95 may be spaced upward from the stage 3. For example, the discharge nozzle 95 may be positioned at a higher vertical level than the vertical level of the stage 3. A plurality of discharge nozzles 95 may be provided. The discharge nozzle 95 may be connected to the discharge ring 93. Referring to FIGS. 8 to 11, the discharge nozzle 95 may include a discharge body 951, a piezoelectric element 953, an elastic portion 955, a filter 957, a first fixing ring R1, and a second fixing ring R2. The discharge body 951 may include a spray space 951*a* and a central hole 951*b* (see, e.g., FIG. 10). An internal pressure of the discharge ring 93 may mean a pressure of a discharge passage 93*h*. The internal pressure of the discharge ring 93 may be substantially the same as the pressure of the spray space 951a. The spray space 951a may be connected to the discharge passage 93h and may receive the cleaning agent CL from the discharge passage 93h. The central hole 951b may discharge the cleaning agent CL. The cleaning agent CL inside the discharge nozzle 95 may be sprayed into the process space 1h through the central hole 951b. The central hole 951b may extend in a horizontal direction toward a central axis of the stage 3. However, the inventive concept is not limited thereto, and the central hole 951b may extend vertically downward instead of horizontally. The piezoelectric element 953 may generate voltage when mechanical stress is applied. Conversely, mechanical deformation may occur in the piezoelectric element 953 when voltage is applied. The piezoelectric element 953 may include quartz, tourmaline, Rochelle salt, barium titanate, monoammonium phosphate, and so forth. However, the piezoelectric element 953 is not limited thereto and may further include materials that undergo mechanical deformation when voltage is applied. Mechanical deformation that occurs when voltage is applied to the piezoelectric element 953 may cause changes in pressure of the discharge passage 93h and the spray space 951a. The elastic portion 955 may respond to pressure changes inside the discharge nozzle 95 generated by the piezoelectric element 953. The elastic portion 955 may be opened and closed by the piezoelectric element 953. The elastic portion 955 may be formed of or include one of rubber, acrylic, aluminum, aluminum alloy, copper, and bronze. However, the inventive concept is not limited thereto, and the elastic portion 955 may include a material that has restoring force after a shape thereof has been deformed by external pressure. The elastic portion 955 may provide an elastic hole 955h (see, e.g., FIG. 11). The elastic hole 955h may be opened and closed by the piezoelectric element 953. The elastic portion 955 may control a spraying cycle and a spraying amount of the cleaning agent CL using the piezoelectric element 953. The filter 957 may be disposed between the elastic portion 955 and the discharge ring 93. The filter 957 may block an inflow of foreign substances into the discharge nozzle 95. The first fixing ring R1 may fix the elastic portion 955 relative to the discharge body 951. The elastic portion 955 may not be bent toward the discharge nozzle 95 by the first fixing ring R1. The second fixing ring R2 may be spaced apart from the first fixing ring R1 toward a direction of the discharge ring 93. The filter 957 may be fixed relative to the discharge body 951 by the first fixing ring R1 and the second fixing ring R2.

Figure 12:
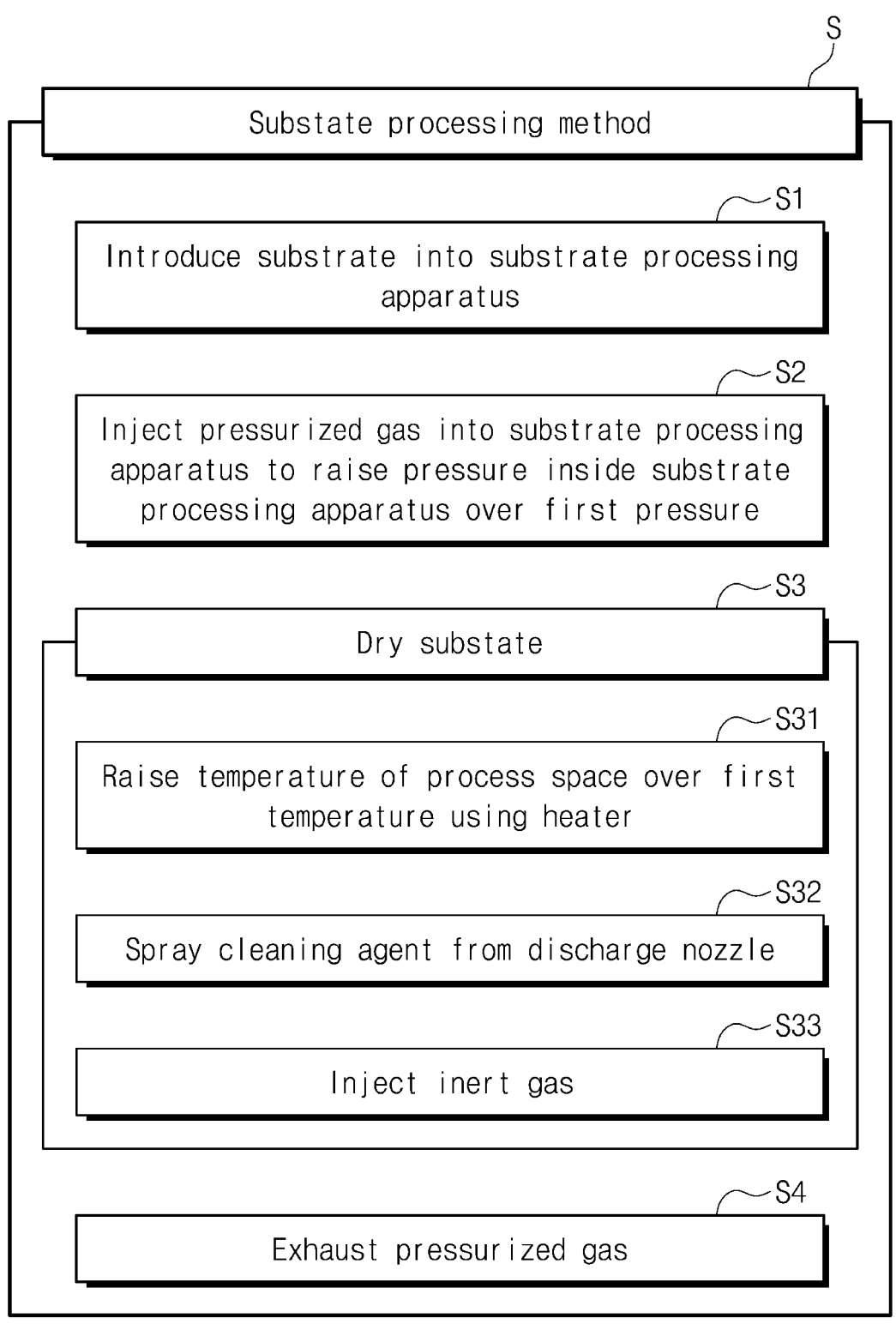
FIG. 12 is a flowchart illustrating a substrate processing method according to embodiments of the inventive concept.

FIG. 12 is a flowchart illustrating a substrate processing method S according to embodiments of the inventive concept.

Referring to FIG. 12, the substrate processing method S may include inserting a substrate W into a substrate processing apparatus SD in S1, injecting pressurized gas into the substrate processing apparatus SD to raise a pressure inside the substrate processing apparatus SD above a first pressure in S2, and drying the substrate W after the pressure inside the substrate processing apparatus SD becomes more than the first pressure in S3. The drying of the substrate W in S3 may include raising a temperature of a process space 1h over a first temperature using a heater 2 in S31, spraying a cleaning agent CL from a discharge nozzle 95 after raising the temperature of the process space 1h to the first temperature or higher in S32, and injecting inert gas in S33.

Referring to FIGS. 1 and 12, inserting a substrate W into the substrate processing apparatus SD in S1 may include separating the first process chamber 11 from the second process chamber 13, and placing the substrate W on the raised support pin 3P. After the substrate W is placed on the support pin 3P, the first process chamber 11 and the second process chamber 13 may be coupled using the coupling portion 15. The process space 1h may be sealed by the coupling portion 15.

The increasing of the pressure inside the substrate processing apparatus SD above the first pressure S2 may be performed by the pressurizing pump 7. The pressure of the process space 1h may be increased to more than the first pressure by the inlet pump 71. The first pressure may be 2.5 atm or more. In detail, the first pressure may be 3 atm. Referring to FIGS. 4 and 12, as the pressure in the process space 1h increases above the first pressure, a boiling point of the cleansing agent CL may also increase. In detail, the boiling point of IPA may be 82.6° C. at atmospheric pressure. When the pressure in the process space 1h rises to 3 atm, the boiling point of IPA may rise to over 115° C.

The raising of the temperature of the process space 1h above the first temperature in S31 may be performed by heating the process space 1h using the heater 2. As the process space 1h is heated, a vapor pressure of the cleaning agent CL may increase. When the vapor pressure of the cleaning agent CL becomes equal to the increased pressure of the process space 1h, the cleaning agent CL may vaporize. When the increased temperature of the cleaning agent CL becomes the same as the boiling point of the cleaning agent CL, the cleaning agent CL may vaporize. As the pressure of the process space 1h increases to a level higher than atmospheric pressure, the temperature of the cleaning agent CL may be raised to a level higher than the boiling point of the cleaning agent CL at atmospheric pressure. By adjusting the heater 2, the vapor pressure of the cleaning agent CL may be maintained below the pressure of the process space 1h. In detail, as the pressure of the process space 1h is increased to 3 atm, IPA may not be vaporized even when the temperature of the process space 1h is increased to 110° C. or higher. Therefore, referring to FIGS. 5 and 12, by increasing the temperature of the IPA, IPA with the surface tension lowered to 13 dyne/cm or less may be used. That is, increasing the temperature of the process space 1h to the first temperature or higher may include increasing the temperature of the process space 1h to reduce the surface tension of the cleaning agent CL to 13 dyne/cm or less.

The spraying of the cleaning agent CL from the discharge nozzle 95 in S32 may include applying a voltage to the piezoelectric element 953 to generate mechanical deformation of the piezoelectric element 953, and controlling the injection amount and injection cycle of the cleaning agent CL sprayed from the elastic hole 955h by mechanical deformation of the piezoelectric element 953 and elasticity due to mechanical deformation of the piezoelectric element 953. This may include controlling the injection amount and injection cycle of the cleaning agent CL sprayed from the hole 955h. An internal pressure of the discharge ring 93 and a pressure of the spray space 951a may be similar to the pressure of the process space 1h. When voltage is applied to the piezoelectric element 953, mechanical deformation of the piezoelectric element 953 may occur, resulting in a change in the pressure of the spray space 951a. The elastic hole 955h of the elastic portion 955 may open due to the change in pressure in the spray space 951a, and the cleaning agent CL may be sprayed into the process space 1h. An extension direction of the central hole 951b and an extension direction of the elastic hole 955h may be the same. The extension direction of a hole may be the direction in which a fluid travels through the hole when the hole is opened. The central hole 951b may extend in a horizontal direction toward the central axis of the stage 3. Accordingly, the cleaning agent CL may be discharged from the discharge nozzle 95 in the horizontal direction into the process space 1*h*. The cycle and amount of spraying of the cleaning agent CL through the elastic portion 955 may be controlled by controlling the piezoelectric element 953.

After spraying the cleaning agent CL from the discharge nozzle 95, the injecting of the inert gas in S33 may include spraying nitrogen gas. That is, the inert gas may include nitrogen gas. However, the inert gas is not limited thereto.

The substrate processing method S may further include discharging pressurized gas from the process space 1*h* in S4 after the drying of the substrate W. The discharging of the pressurized gas in S4 may be performed using the outlet pump 73. The pressurized gas may be discharged, the internal pressure of the process chamber 1 may be adjusted to equal atmospheric pressure, and then the first process chamber 11 and the second process chamber 13 may be separated.

According to the substrate processing apparatus and the substrate processing method using the same according to embodiments of the inventive concept, the pressure inside the process chamber may be increased. In detail, after the first process chamber and the second process chamber are combined by a coupling portion, the pressure of the process space may be increased to 2.5 atm or more using a pressurizing pump.

According to the substrate processing apparatus and the substrate processing method using the same according to embodiments of the inventive concept, the boiling point of the cleaning agent may increase as the pressure in the process space increases. As a boiling point of IPA is 82.5° C. at atmospheric pressure, the drying process may only be possible at temperatures below 82.5° C. under atmospheric pressure. When the pressure in the process space is increased to 3 atm, a boiling point of IPA may rise to over 115° C. Therefore, as the pressure in the process space is increased, the drying process using higher temperature IPA may be performed.

According to the substrate processing apparatus and the substrate processing method using the same according to embodiments of the inventive concept, the cleansing agent with lower surface tension may be used, thereby decreasing pattern collapse of the substrate. As the temperature of the cleaning agent increases, the surface tension of the cleaning agent may decrease. In the case of IPA, the surface tension may be around 17.1 dyne/cm at 80° C. When the temperature of IPA rises above 115° C., the surface tension may be lowered to the level of 10 dyne/cm. Due to the lowered surface tension, a force that causes the pattern collapse of the substrate may be reduced. Therefore, using IPA at 115° C. may make the pattern height higher than when using IPA at 80° C. For example, when using IPA at 115° C., the height of the pattern may be Increased by about 14%.

According to the substrate processing apparatus and the substrate processing method using the same according to embodiments of the inventive concept, the cleaning agent may be precisely discharged even within a high-pressure process chamber. In detail, the pressure inside the discharge nozzle may be adjusted to be the same as the process space. Afterwards, the elastic hole of the elastic portion may be finely adjusted by slightly changing the pressure inside the discharge nozzle using a piezoelectric element. As the cycle and magnitude of the voltage applied to the piezoelectric element are adjusted, the cycle and amount at which the cleaning agent is discharged may thus be adjusted.

According to the substrate processing apparatus and the substrate processing method using the same of the inventive concept, the internal pressure of the process chamber may be increased.

According to the substrate processing apparatus and the substrate processing method using the same of the inventive concept, the internal temperature of the process chamber may be increased.

According to the substrate processing apparatus and the substrate processing method using the same of the inventive concept, the boiling point of the cleaning agent may be increased.

According to the substrate processing apparatus and the substrate processing method using the same of the inventive concept, the spray amount of the cleaning agent discharged from the elastic portion may be controlled by the piezoelectric element.

According to the substrate processing apparatus and the substrate processing method using the same of the inventive concept, the spray cycle of the discharged cleaning agent from the elastic portion may be controlled by the piezoelectric element.

The effects of the inventive concept are not limited to the effects mentioned above, and other effects not mentioned will be clearly understood by those skilled in the art from the description below.

While embodiments are described above, a person skilled in the art may understand that many modifications and variations are made without departing from the spirit and scope of the inventive concept. Accordingly, the example embodiments of the inventive concept should be considered in all respects as illustrative and not restrictive, with the spirit and scope of the invention being indicated by the appended claims.

What is claimed is:

1. A substrate processing apparatus comprising:
   a process chamber including a process space;
   a stage configured to support a substrate;
   a rotator configured to rotate the stage;
   a pressurizing pump configured to increase a pressure in the process space; and
   a cleaning agent discharger configured to spray a cleaning agent into the process space,
   wherein the cleaning agent discharger includes:
      a discharge ring including a discharge path through which the cleaning agent flows; and
      a plurality of discharge nozzles connected to the discharge ring and spaced apart in a circumferential direction about a central axis of the stage,
   wherein each discharge nozzle of the plurality of discharge nozzles includes an elastic portion including an elastic hole that is configured to be opened and closed,
   wherein each discharge nozzle of the plurality of discharge nozzles further includes:
      a discharge body including a spray space and a central hole;
      a piezoelectric element configured to open and close the elastic hole of the corresponding elastic portion; and
      a filter between the elastic portion and the discharge ring, the filter being configured to block an inflow of foreign substances into the discharge nozzle, and
   wherein the elastic portion of each discharge nozzle of the plurality of discharge nozzles is configured to control a spraying cycle and a spraying amount of the cleaning agent.

2. The substrate processing apparatus of claim 1, wherein the process chamber includes:

a first portion;

a second portion selectively coupled to the first portion to open and close the process space; and a coupling that couples the first portion with the second portion to seal the process space.

3. The substrate processing apparatus of claim 1, further comprising a first heater inside the stage and configured to apply heat to the stage, wherein the stage further includes a support pin configured to move up and down.

4. The substrate processing apparatus of claim 1, further comprising:

an infrared light source configured to apply infrared light to the stage; and a second heater coupled to one of an upper surface or side surfaces of the process chamber to face the stage.

5. The substrate processing apparatus of claim 1, wherein the pressurizing pump includes:

an inlet pump connected to one side of the process space to inject pressurized gas into the process space; and an outlet pump connected to the other side of the process space to discharge pressurized gas in the process space.

6. The substrate processing apparatus of claim 1, further comprising an inert gas nozzle configured to inject an inert gas into the process space.

7. A substrate processing apparatus comprising:

a process chamber including a process space;

a stage in the process space and configured to support a substrate;

a rotator below the stage and configured to rotate the stage;

a pressurizing pump configured to increase a pressure in the process space; and a cleaning agent discharger configured to spray a cleaning agent into the process space, wherein the cleaning agent discharger includes:

a discharge ring including a discharge passage; and a discharge nozzle connected to the discharge ring, and wherein the discharge nozzle includes:

a discharge body including a spray space connected to the discharge passage and a central hole through which the cleaning agent is sprayed into the process space;

a piezoelectric element; and an elastic portion including an elastic hole that is opened and closed by the piezoelectric element, the elastic portion being configured to discharge the cleaning agent from the discharge passage into the process space to control a spraying cycle and a spraying amount of the cleaning agent.

8. The substrate processing apparatus of claim 7, wherein the discharge nozzle includes:

a first fixing ring fixing the elastic portion to the discharge body;

a second fixing ring spaced apart from the first fixing ring in a direction of the discharge ring; and a filter between the piezoelectric element and the elastic portion, fixed to the discharge body by the first fixing ring and the second fixing ring, and configured to block an inflow of foreign substances into the discharge nozzle.

9. The substrate processing apparatus of claim 7, wherein the cleaning agent discharger includes a plurality of discharge nozzles that are provided to be spaced upward from the stage and arranged in a circumferential direction about a central axis of the stage, wherein the discharge nozzle is one of the plurality of discharge nozzles.

10. The substrate processing apparatus of claim 7, wherein the process chamber includes:

a first portion;

a second portion configured to be coupled to the first portion; and a coupling between the first portion and the second portion and configured to couple the first portion with the second portion, wherein the first portion and the second portion are separated from each other in an uncoupled state such that a substrate is configured to be introduced into the process chamber in the uncoupled state.

11. The substrate processing apparatus of claim 7, wherein the stage includes support pins configured to support the substrate and move up and down, a second heater on the stage and configured to heat an upper surface of the stage; and a first heater within the stage and including a heating wiring configured to heat the upper surface of the stage.

12. The substrate processing apparatus of claim 9, wherein a central hole of each of the plurality of discharge nozzles extends horizontally toward the central axis of the stage.

13. The substrate processing apparatus of claim 7, further comprising an inert gas nozzle configured to spray an inert gas on the stage, wherein the pressurizing pump includes:

an inlet pump configured to increase a pressure of the process space to 2.5 atmospheres or more; and an outlet pump configured to lower the pressure of the process space.

* * * * *